United States Patent [19]
Weng et al.

[11] Patent Number: 5,901,158
[45] Date of Patent: May 4, 1999

[54] ERROR CORRECTION ENCODER/DECODER

[75] Inventors: Lih-Jyh Weng, Needham; Ba-Zhong Shen, Shrewsbury, both of Mass.; Shih Mo, Milpitas, Calif.

[73] Assignee: Quantum Corporation, Milpitas, Calif.

[21] Appl. No.: 08/837,752

[22] Filed: Apr. 22, 1997

[51] Int. Cl.$^6$ ............................................. H03M 13/00
[52] U.S. Cl. ........................... 371/37.12; 371/37.11; 371/47.1; 371/40.1; 371/37.12; 395/200.68; 341/94
[58] Field of Search ....................... 371/37.11, 47.1, 371/37.12; 395/200.68

[56] References Cited

PUBLICATIONS

Fettweis and Hassner, "A Combined Reed–Solomon Encoder and Syndrome Generator with Small Hardware Complexity," IEEE Int. Symp. on Circuits and Systems, pp. 1871–1874.

*Primary Examiner*—Reba I. Elmore
*Assistant Examiner*—Iván Calcaño
*Attorney, Agent, or Firm*—Patricia Sheehan

[57] ABSTRACT

The encoder/decoder system uses encoder hardware to encode data symbols and form a data code word. To decode, the system uses the same encoder hardware to determine a residue r(x), i.e.

$$r(x) = \frac{C_r(x)}{g(x)},$$

where $C_r(x)$ is the retrieved code word and $g(x)$ is the generator polynomial. If the residue is all zeros, the ECC code word is error-free and the system need not calculate the error syndrome. If the residue is non-zero, the encoder hardware is used, with various switches in different settings, to include certain multipliers in and exclude other multipliers from the further decoding operations of encoding the residue symbols to produce partial error syndromes that are the coefficients of the error syndrome polynomial.

11 Claims, 2 Drawing Sheets

ERROR CORRECTION ENCODER/DECODER

FIELD OF THE INVENTION

The invention relates to a combination error correction encoder and decoder.

BACKGROUND OF THE INVENTION

The importance of error correction coding of data in digital computer systems has increased greatly as the density of the data recorded on mass storage media, more particularly disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is written to a disk, it is mathematically encoded to form ECC symbols. The ECC symbols are then appended to the data string to form data code words—data symbols plus ECC symbols—and the data code words are written to or stored on the disks. When data is to be read from the disks, the data code words containing the data symbols to be read are retrieved from the disks and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital data can contain multiple errors. One of the most effective types of ECC used for the correction of multiple errors is a Reed-Solomon code [For a detailed description of Reed-Solomon codes, see Peterson and Weldon, *Error Correction Codes*]. To correct multiple errors in strings of data symbols, Reed-Solomon codes efficiently and effectively utilize the various mathematical properties of sets of symbols known as Galois Fields, represented "GF $(P^q)$", where "P" is a prime number and "q" can be thought of as the number of digits, base P, in each element or symbol in the field. "P" usually has the value 2 in digital computer applications and, therefore, "q" is the number of bits in each symbol.

To correct errors in the data code words, the error syndrome polynomial is produced. The error syndrome polynomial is used, in turn, to produce error locator and error evaluator polynomials, which are used, respectively, to determine the locations and values of the code word errors.

In many prior known systems separate encoders and decoders are used to encode and decode the data code words. Thus, there is hardware that is not in use for one of the encoding or decoding operations.

In certain other prior known systems the decoders are modified, to also perform the encoding operation. These systems generally use a hardware configuration that is described in a 1992 article by Fettweis and Hassner entitled "A combined Reed-Solomon Encoder and Syndrome Generator with Small Hardware Complexity," IEEE Int. Symp. on Circuits and Systems pp. 1871–1874. This hardware saves on gate count over the separate encoder and decoder, but has latency problems, as discussed in the article.

We have invented an encoder/decoder that has a reduced gate count over separate encoders and decoders, and does not have the latency problems of the Fettweis and Hassner configuration. A modified version of this encoder/decoder can also be used to encode and decode with the modified Reed Solomon codes described in a co-pending U.S. patent application Ser. No. 08/749,235 entitled MODIFIED REED SOLOMON CODE SELECTION AND ENCODING SYSTEM, which is assigned to a common assignee and included herein by reference. The modified Reed Solomon codes encode w-bit data symbols over $GF(2^{w+i})$ to produce (w+i)-bit ECC redundancy symbols. The encoding operations involve further manipulating the (w+i)-bit ECC redundancy symbols and a number of "pseudo redundancy symbols," to form a data code word with symbols in $GF(2^w)$. The decoding operations decode the data code word, including the ECC symbols and the pseudo redundancy symbols, to reproduce error-free w-bit data symbols.

SUMMARY OF THE INVENTION

The encoder/decoder system uses encoder hardware to encode data symbols and form a data code word. To decode, the system uses the same encoder hardware to determine a residue r(x), i.e.

$$r(x) = \frac{C_r(x)}{g(x)},$$

where $C_r(x)$ is the retrieved code word and g(x) is the generator polynomial. If the residue is all zeros, the ECC code word is error-free and the system need not calculate the error syndrome.

If the residue is non-zero, the encoder hardware is used, with various switches in different settings, essentially to include certain multipliers in and exclude other multipliers from the further decoding operations of calculating the coefficients of the error syndrome. The system, with the switches in the appropriate settings, encodes the residue symbols to produce partial error syndromes that are the coefficients of the error syndrome polynomial.

The system does not include additional components such as adders in the feedback path during decoding operations, and thus, does not have the associated increase in the latency of the encoder/decoder system of the prior known encoder/decoder systems.

BRIEF DESCRIPTION OF THE DRAWINGS

The invention description below refers to the accompanying drawings, of which.

DETAILED DESCRIPTION OF AN ILLUSTRATIVE EMBODIMENT

All mathematical operations discussed herein are Galois Field operations.

Figure 1:
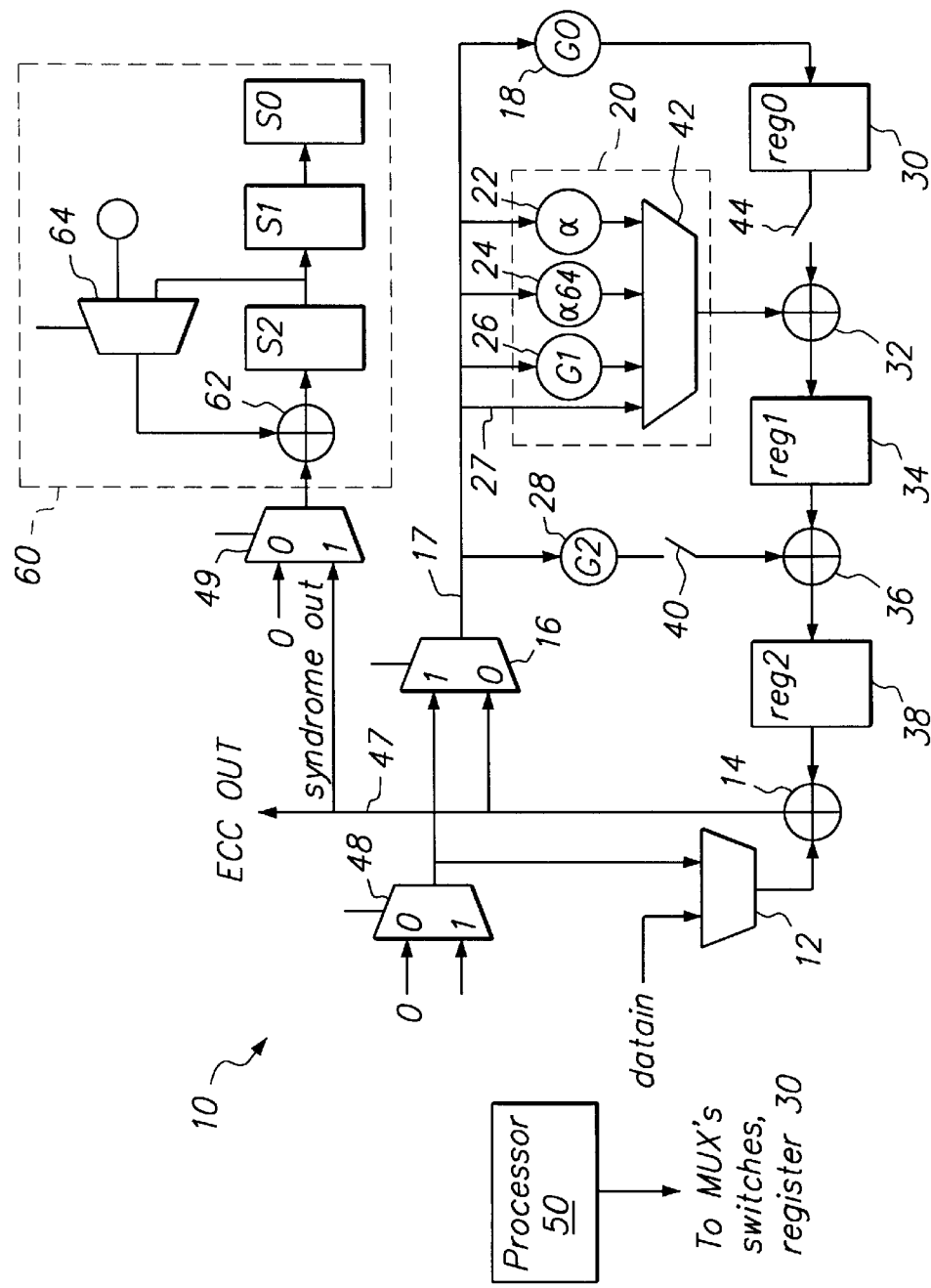
FIG. 1 is a functional block diagram of an encoder/decoder constructed in accordance with the invention.

FIG. 1 depicts an encoder/decoder 10 that operates in accordance with an ECC over $GF(2^w)$ with a generator polynomial $$g(x)=x^3+g_2x^2+g_1x^1+g_0.$$

In an example, the generator polynomial is $$g(x)=x^3+\alpha^{300}x^2+\alpha^{365}x^1+\alpha^{195}=(x-\alpha^{64})*(x-\alpha^{65})*(x-\alpha^{66}),$$

where * represents multiplication. The code is a distance four code.

The encoder divides the data symbols d(x) by the generator polynomial and produces a remainder t(x), which is the set of ECC redundancy symbols. The ECC redundancy symbols are appended to the data symbols to form a data code word $C(x)$ that is divisible by the generator polynomial:

$$C(x)=d(x)+t(x).$$

To encode the data, the data symbols are fed serially into the system 10 through a multiplexer 12 and an adder 14. The adder 14 adds successive data symbols to the contents of a register 38. The product is applied through a second multiplexer 16 to Galois Field multipliers 18 and 28 and to Galois Field multiplier 26 through a multiplier subsystem 20. The multiplier subsystem 20 is under the control of a processor 50, which also controls the multiplexers in the system. The physical connections between the processor 50 and the other system components are not shown in the drawing.

The multiplier subsystem 20 includes a set of switches 42 that, under the control of the processor 50, pass to an adder 32 the symbol on line 27 or the product produced by one of the Galois Field multipliers 22, 24 or 26. The set of switches 42 may instead be a 4-to-1 multiplexer (not shown), which would also be under the control of the processor 50. As discussed below, Galois Field multiplier 26 is used during encoding, and Galois Field multipliers 24 and 22 and line 27 are used during decoding.

For encoding, the Galois Field multipliers 18, 26 and 28 multiply the data symbols by the coefficients of the generator polynomial, with multiplier 18 multiplying the data symbols by $g_0$, multiplier 26 multiplying the data symbols by $g_1$ and multiplier 28 multiplying the data symbols by $g_2$. Switches 40 and 44, which are also controlled by the processor 50, are in the closed positions. The products produced by the Galois Field multipliers 26 and 28 are added in adders 32 and 36 to the contents of registers 30 and 34, respectively. The sums then update the registers 34 and 38. The product produced by Galois Field multiplier 18 updates the register 30.

When all of the data symbols have been encoded, the registers 30, 34 and 38 contain the ECC redundancy symbols. To pass the ECC symbols out of the system 10, multiplexer 12 supplies to the adder 14 all zero symbols, which the multiplexer receives from multiplexer 48. The multiplexer 48 also supplies the all zero symbols to multiplexer 16, which then passes the symbols to the Galois Field multipliers 18, 26 and 28. The ECC redundancy symbols are serially passed from the system 10 on line 47, and the contents of the registers are updated to all zeros. Alternatively, the ECC redundancy symbols may be read from the registers in parallel, and the registers thereafter set to all zeros.

Once the ECC redundancy symbols are passed from the system 10, the symbols are appended to the data, to produce a data code word $C(x)$. The data code word may be stored on a magnetic disk (not shown).

To decode a received data codeword, $C_r(x)$, for example, a data code word read from the disk (not shown), the system 10 operates in the same manner described above to encode all of the data codeword symbols, including the ECC redundancy symbols. If the received data codeword is error-free, that is, if $C_r(x)=C(x)$, the code word is divisible by the generator polynomial and the residue, $r(x)$, is zero:

$$r(x) = \frac{C_r(x)}{g(x)} = \frac{C(x)}{g(x)} = 0$$

Accordingly, the registers 30, 34 and 38 contain all zeros, and no error correcting is required. Thus, the system 10 does not produce the error syndrome.

If the residue $r(x)$ is not all zeros, it indicates that there are errors in the received codeword $C_r(x)$, that is, $C_r(x) \neq C(x)$. The system 10 then calculates the associated error syndrome based on the residue $r(x)=r_2x^2+r_1x^1+r_0x$, where the coefficients $r_2$, $r_1$, and $r_0$ are the contents of the registers 38, 34 and 30, respectively.

The system 10 calculates the partial error syndromes $S_{64}$, $S_{65}$ and $S_{66}$, which are the coefficients of the error syndrome polynomial:

$$S(x)=S_{64}+S_{65}x+S_{66}x^2.$$

To calculate the partial error syndromes the system 10 evaluates the residue at the roots of the generator polynomial, that is, the system evaluates:

$$S_i=r_2x^2+r_1x+r_0 \text{ at } x=\alpha^i, \text{ for } i=64, 65, 66.$$

To calculate the first partial error syndrome, $S_{64}$, the processor 50 controls the set of switches 42 in the multiplier subsystem 20 to pass the product produced by the multiplier 24 to adder 32. Multiplier 24 multiplies the symbol on line 17 by $\alpha^{64}$, which is the lowest root of the generator polynomial.

The processor 50 also opens switches 44 and 40, controls the multiplexer 12 to pass all zero symbols to adder 14, and controls the multiplexer 16 to pass the sum produced by the adder 14 to the Galois Field multipliers. Further, the processor 50 operates the register 30 such that it feeds back its contents during its update operations. Thus, the register 30 is updated to $r_0$ for each count.

The partial error syndrome generating operations of the system 10 are best described in "counts," which represent series of operations that change the contents of some or all of the registers. In a first count of the operations to calculate the first partial syndrome $S_{64}$, the symbol $r_2$, which is contained in register 38, is passed through adder 14 where it is summed with all zero symbols. The sum, which is the symbol $r_2$, is then passed through multiplexer 16 to the Galois Field multipliers 18, 24 and 28. The Galois Field multiplier 24 multiplies the symbol $r_2$ by $\alpha^{64}$ and passes the product $r_2\alpha^{64}$ to adder 32. The adder 32, with switch 44 open, passes the product unchanged to register 34.

The product produced by the Galois Field multiplier 28 is not passed beyond the open switch 40. At the same time, the symbol $r_1$, which is contained in register 34 is passed to the adder 36, which with switch 40 open passes the symbol unchanged to the register 38. The register 30, as discussed above updates its contents to $r_0$ for the count. Thus the product produced by Galois Field multiplier 18 is ignored.

At the end of the first count, the registers contain:

| register 38 | register 34 | register 30 |
| --- | --- | --- |
| $r_1$ | $r_2\alpha^{64}$ | $r_0$ |

For the second count, the switch 44 is closed and the symbol $r_1$ contained in register 38 is applied through the adder 14, which adds all zeros, to the multiplexer 16, which passes the symbol to the Galois Field multipliers. The Galois Field multiplier 24 multiplies the symbol by $\alpha^{64}$ to produce the product $r_1\alpha^{64}$ which is then added, in adder 32 to the symbol $r_0$ that is contained in register 30. At the same time the contents of register 34 are passed unchanged to the register 38 through adder 36, with switch 40 still in the open position. Again, the register 30 updates to $r_0$. Thus, at the end of the second count, the registers contain:

| register 38 | register 34 | register 30 |
|---|---|---|
| $r_2\alpha^{64}$ | $r_1\alpha + r_0$ | $r_0$ |

For the third count, switch 44 is again opened. The contents of the register 34 are passed unchanged to the register 38, through adder 36. The contents of register 38 are multiplied by $\alpha^{64}$ in multiplier 24, and the product is passed unchanged through adder 32 to the register 34. The registers as the end of the third count contain:

| register 38 | register 34 | register 30 |
|---|---|---|
| $r_1\alpha^{64} + r_0$ | $r_2\alpha^{64} * \alpha^{64} = r_2(\alpha^{64})^2$ | $r_0$ |

The contents of the registers 38 and 34 are then shifted to syndrome registers 60 in the next two counts, with the multiplier subsystem 20 connecting line 27 to the adder 32 and closing switch 44 for the first of these two counts. Thus in the fourth count, the term $r_1\alpha^{64}+r_0$ is passed to the syndrome register 60 and also to adder 32 where $r_0$ is added to the term and the sum passed to register 34. At the same time, the contents of register 34 are passed to the register 38 through adder 36. Thus as the end of the fourth count the registers contain:

| register 38 | register 34 | register 30 |
|---|---|---|
| $r_2(\alpha^{64})^2$ | $r_1\alpha^{64}$ | $r_0$ |

For the fifth count, the contents of register 38 are passed to the syndrome registers 60, where they are added to the previous contents of the register by adder 62. The syndrome registers thus contain the partial error syndrome $$S_{64}=(r_2\alpha^{64})^2+r_1\alpha^{64}+r_0=r_2\alpha^{128}+r_1\alpha^{64}+r_0.$$

The system next calculates the second partial error syndrome:

$$S_{65}=r_2(\alpha^{65})^2+r_1\alpha^{65}+r_0=r_2\alpha^{130}+r_1\alpha^{65}+r_0$$

as $$S_{65}=r_2\alpha^{128}*\alpha^2+r_1\alpha^{64}*\alpha+r_0.$$

To do this the system repeats the operations discussed above, that is, it repeats counts one through four, using multiplier 22 in place of multiplier 24. Thus, during counts 1–4, the contents of register 38 are multiplied by $\alpha$ instead of $\alpha^{64}$.

At the same time, the partial syndrome $S_{64}$ is shifted to syndrome register $S_0$ and the registers $S_2$ and $S_1$ are reset to all zeros by applying all-zero symbols through multiplexer 49. The syndrome registers $S_1$ and $S_2$ may instead be reset to all zeros.

The fifth count of calculating $S_{64}$ discussed above, when the term $r_2\alpha^{128}$ is passed to the syndrome registers, is also the first count of calculating $S_{65}$. The term $r_2\alpha^{128}$ is thus multiplied by $\alpha$ in multiplier 22 and is then passed unchanged through adder 32 to register 34. The chart below depicts the contents of the registers at the end of each count of calculating $S_{65}$:

| Count | register 38 | register 34 | register 30 |
|---|---|---|---|
| 1 | $r_1\alpha^{64}$ | $r_2\alpha^{128}*\alpha$ | $r_0$ |
| 2 | $r_2\alpha^{128}*\alpha$ | $r_1\alpha^{64}*\alpha + r_0$ | $r_0$ |
| 3 | $r_1\alpha^{64}*\alpha + r_0$ | $r_2\alpha^{128}*\alpha^2$ | $r_0$ |
| 4 | $r_2\alpha^{128}*\alpha^2$ | $r_1\alpha^{64}*\alpha$ | $r_0$ | with the fourth count passing the contents of register 38, namely, term $r_1\alpha^{64}*\alpha+r_0$, to the syndrome registers 60 and the fifth count passing the updated contents of register 38, namely, term $r_2\alpha^{128}*\alpha^2$, to the syndrome registers. The adder 62 adds the two terms to produce the partial error syndrome $S_{65}=r_2\alpha^{128}*\alpha^2+r_1\alpha^{64}*\alpha+r_0=r_2\alpha^{130}*r_1\alpha^{65}+r_0$. This partial syndrome is held in syndrome register $S_1$.

The fifth count is also the first count in the calculation of the third partial syndrome $S_{66}=r_2\alpha^{132}+r_1\alpha^{66}+r_0$, which is calculated as:

$$S_{66}=(r_2\alpha^{128}*\alpha^2)*\alpha^2+r_1(\alpha^{64}*\alpha)*\alpha+r_0=r_2\alpha^{130}*\alpha^2+r_1\alpha^{65}*\alpha+r_0.$$

The chart below depicts the contents of the registers at the end of each count of calculating $S_{66}$:

| Count | register 38 | register 34 | register 30 |
|---|---|---|---|
| 1 | $r_1\alpha^{64}*\alpha$ | $r_2\alpha^{128}*\alpha^2*\alpha$ | $r_0$ |
| 2 | $r_2\alpha^{128}*\alpha^2*\alpha$ | $r_1\alpha^{64}*\alpha^2 + r_0$ | $r_0$ |
| 3 | $r_1\alpha^{64}*\alpha^2 + r_0$ | $r_2\alpha^{128}*\alpha^2*\alpha^2$ | $r_0$ |
| 4 | $r_2\alpha^{128}*\alpha^2*\alpha^2$ | $r_1\alpha^{64}*\alpha^2$ | $r_0$ |

The contents of register 38 are sent to the syndrome registers during counts 3 and 4, where they are added by adder 62. The sum in then held in register $S_2$.

The system 10 may be used with any Reed Solomon code generator polynomial, $$g(x)=x^{D-1}+g_{D-2}X^{D-2}+\ldots+g_0$$

The system includes a set of multipliers, registers and adders for each of the coefficients $g_i$ of the generator polynomial.

Figure 2:
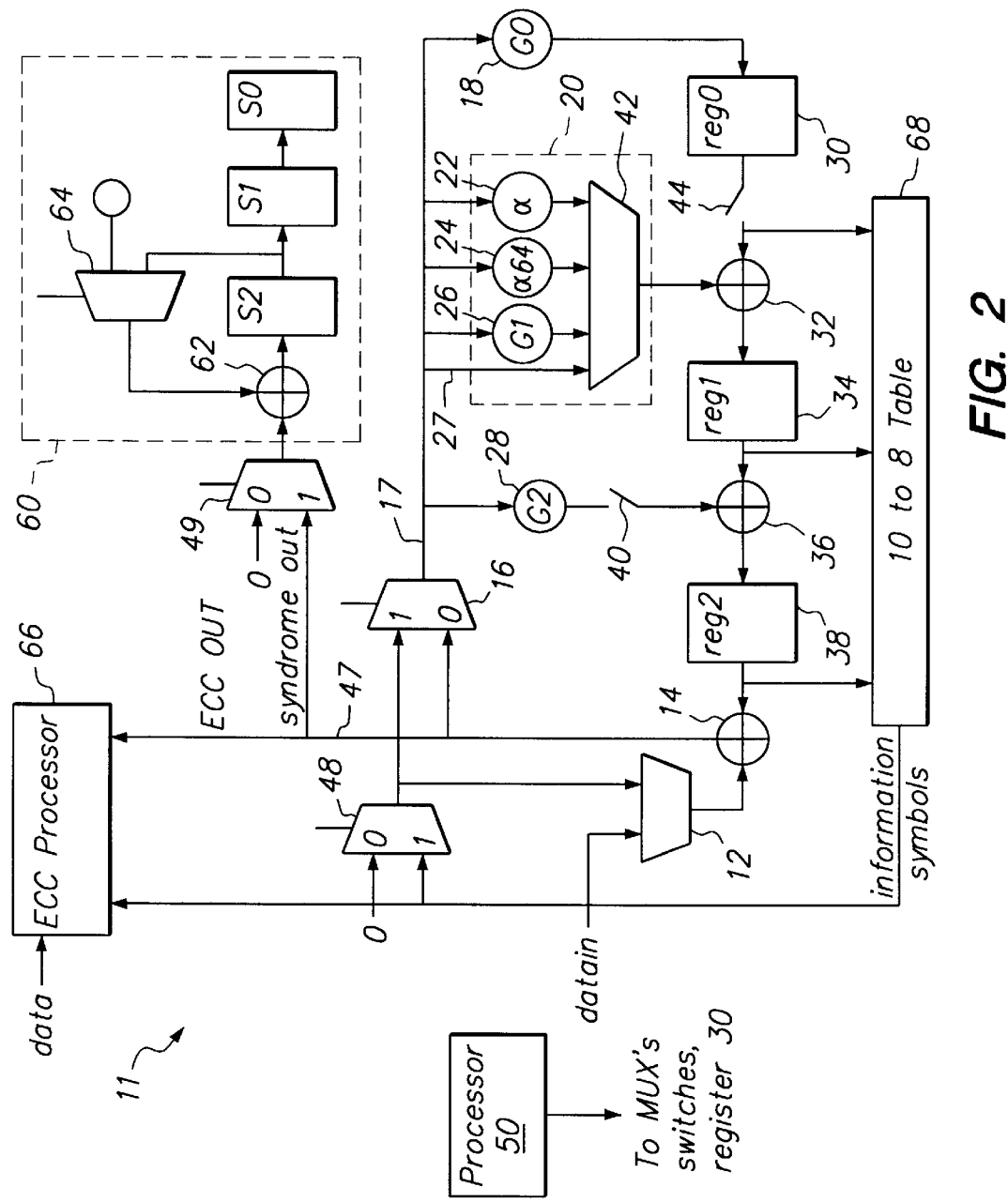
FIG. 2 is a functional block diagram of the encoder/decoder of FIG. 1 modified for use with the modified Reed Solomon codes.

Referring now to FIG. 2, a system 11 operates with a modified Reed Solomon code to encode w-bit data symbols to produce (w+i)-bit ECC symbols. The ECC symbols are then manipulated into (w+i)-bit symbols that have i bits set in a predetermined pattern. As part of the manipulation operations, a number of (w+i)-bit pseudorandom redundancy symbols that also have i bits set in the pattern are appended to the ECC symbols. The i-bit pattern is then truncated from the manipulated ECC symbols and the pseudo redundancy symbols, to form a data code word with w-bit symbols. The pseudo redundancy symbols are required for the proper decoding of the code word.

The ECC manipulation operations, which are performed by an ECC processor 64 are discussed in more detail in co-pending application Ser. No. 08/749,235, entitled MODIFIED REED SOLOMON CODE SELECTION AND ENCODING SYSTEM which is incorporated herein by reference. The ECC manipulation operations involve the encoding of an ECC modifier code word. This ECC modifier code word is combined with a preliminary data code word that includes the data and the (w+i)-bit ECC symbols, to both modify the ECC symbols and append thereto the pseudorandom symbols.

To produce the (w+i)-bit ECC redundancy symbols, the w-bit data symbols have appended to them an i-bit pattern. The (w+i)-bit data symbols are then fed to the system 11 through adder 14 and are encoded as discussed above, to produce the w+i bit ECC symbols. These ECC symbols are appended to the (w+i)-bit data symbols, to form the preliminary data code word.

The (w+i)-bit ECC symbols are then applied to a look-up table 66, which supplies to the encoder the "information" symbols of the ECC modifier code word. These information symbols are then encoded, to produce the ECC modifier code word. This code word is combined with the preliminary data code word, to produce (w+i)-bit ECC symbols that have i bits set in a predetermined pattern, and to append to the symbols the (w+i)-bit pseudo redundancy symbols, each with the i bits set in the predetermined pattern. The i-bits are then truncated from all of the symbols, to produce a code word with w-bit data, ECC and pseudo redundancy symbols.

To decode a received code word, the system 11 encodes all of the code word symbols, including the data, ECC and pseudo redundancy symbols. The system appends the i bit pattern to each of the symbols before applying the symbol to the adder 14, and then encodes the symbols as discussed above., If the residue that is produced is all zeros, the data are error free and the system 11 need not produce the error syndromes.

If the residue is not all zeros, the system calculates the error syndrome as discussed above. It thus opens switches 40 and 44 and uses the multipliers 24 and 22 to multiply the coefficients of the residue by the roots of the generator polynomial. The products are then further encoded to produce the partial error syndromes. The partial error syndromes are:

$$S_i = r_0 + r_1 \alpha^i + \ldots + r_{D-2}(\alpha^i)^{D-2}$$

for $\alpha^i$ equal, respectively, to the roots of the generator polynomial, and where D is the code distance. The partial error syndromes are then used to produce the error syndrome polynomial:

$$S(x) = S_L + S_{L+1}x + \ldots + S_{L+D-2}x^{D-2} \text{ for } x = \alpha^L, \ldots, \alpha^{L+D-2}$$

where $\alpha^L$ is the lowest power root of the generator polynomial and D is the code distance.

The systems 10 and 11 save on gate count over separate encoders and decoders. In the decoding operation, the systems produce the residues using the same multipliers, registers and adders as they use in the encoding operations. They then produce the terms of the partial error syndromes using the same registers and adders along with additional multipliers that take the place of the multipliers used to produce the residue. The systems 10 and 11 do not require additional components in the system feedback paths, and thus, do not have the latency problems of the known prior encoder/decoder systems.

What is claimed is:

1. A combination encoder and decoder for encoding data symbols in accordance with an error correction code to produce error correction redundancy symbols and decoding data code words that include data and error correction redundancy symbols, the combination encoder and decoder including:

A. a plurality of registers, one for each of the error correction redundancy symbols;

B. a plurality of Galois Field multipliers producing products by (i) multiplying symbols by coefficients of a generator polynomial associated with the error correction code, (ii) multiplying symbols by a lowest root of the generator polynomial, and (iii) multiplying symbols by Galois Field element $\alpha$;

C. a plurality of adders connected between the Galois Field multipliers and the registers, the adders producing sums by adding the contents of the registers to the products produced by the Galois Field multipliers and updating the registers with the sums;

D. a plurality of switches associated with the Galois Field multipliers, the switches (i) providing data symbols to the Galois Field multipliers that multiply the symbols by the coefficients of the generator polynomial, and (ii) providing residue symbols and symbols associated with the residue symbols to the Galois Field multiplier associated with the lowest root of the generator polynomial and to the Galois Field multiplier associated with the Galois Field element $\alpha$; and E. error syndrome means for producing partial error syndromes when the plurality of switches provide residue symbols and symbols associated with the residue symbols to the Galois Field multipliers, the error syndrome means producing $S_i = r_0 + r_1 x + \ldots + r_{D-2}x^{D-2}$ for $x = \alpha^L, \alpha^{L+1}, \ldots, \alpha^{L+D-2}$ where $\alpha^L$ is the lowest root of the generator polynomial and D is the code distance.

2. The combination encoder and decoder of claim 1 wherein the plurality of switches prevents the products produced by the Galois Field multipliers that multiply symbols by the coefficients of the generator polynomial from reaching the adders when the residue symbols or symbols associated with the residue symbols are supplied to the Galois Field multipliers.

3. The combination encoder and decoder of claim 1 wherein the register, which is associated with the Galois Field multiplier that multiplies by the constant term of the generator polynomial, updates by feeding back the contents of the register when the residue symbols or symbols associated with the residue symbols are supplied to the Galois Field multiplier.

4. The combination encoder and decoder of claim 3 wherein the plurality of switches prevents the products produced by the Galois Field multipliers that multiply symbols by the remaining coefficients of the generator polynomial from reaching the adders when the residue symbols or symbols associated with the residue symbols are supplied to the Galois Field multipliers.

5. A combination encoder and decoder for encoding w-bit data symbols in accordance with a modified Reed Solomon code to produce (w+i)-bit error correction redundancy symbols and decoding data code words that include w-bit data and w-bit error correction redundancy symbols, the combination encoder and decoder including:

A. a plurality of registers, one for each of the error correction redundancy symbols;

B. a plurality of Galois Field multipliers producing products by (i) multiplying symbols by coefficients of a generator polynomial associated with the modified Reed Solomon code, (ii) multiplying symbols by a lowest root of the generator polynomial, and (iii) multiplying symbols by Galois Field element $\alpha$;

C. a plurality of adders connected between the Galois Field multipliers and the registers, the adders producing sums by adding the contents of the registers to the products produced by the Galois Field multipliers and updating the registers with the sums;

D. manipulating means for manipulating the (w+i)-bit error correction redundancy symbols to produce symbols that have i bits set in a predetermined pattern, the manipulating means truncating the i-bit pattern to produce w-bit error correction redundancy symbols;

E. a plurality of switches associated with the Galois Field multipliers, the switches (i) providing data symbols to the Galois Field multipliers that multiply the symbols by the coefficients of the generator polynomial, and (ii) providing residue symbols and symbols associated with the residue symbols to the Galois Field multiplier associated with the lowest root of the generator polynomial and to the Galois Field multiplier associated with the Galois Field element $\alpha$; and F. error syndrome means for producing partial error syndromes produced when the plurality of switches provide residue symbols and symbols associated with the residue symbols to the Galois Field multipliers, the error syndrome means producing $S_i = r_0 + r_1 x + \ldots + r_{D-2} x^{D-2}$ for $x = \alpha^L, \alpha^{L+1}, \ldots, \alpha^{L+D-2}$ where $\alpha^L$ is the lowest root of the generator polynomial and D is the code distance.

6. The combination encoder and decoder of claim 5 wherein the manipulation means appends to the error correction symbols one or more pseudo redundancy symbols, the error correction symbols and the pseudo redundancy symbols being included in the data code word.

7. The combination encoder and decoder of claim 6 wherein the manipulation means combines an ECC modifier code word with a preliminary code word that includes the data and error correction symbols, to modify the error correction symbols and append to the symbols the pseudo redundancy symbols.

8. The combination encoder and decoder of claim 7 wherein the manipulation means further includes a table for determining one or more information symbols associated with the ECC modifier code word, the combination encoder and decoder encoding the information symbols to produce the ECC modifier code word.

9. The combination encoder and decoder of claim 5 wherein the plurality of switches prevents the products produced by the Galois Field multipliers that multiply symbols by the coefficients of the generator polynomial from reaching the adders when the residue symbols or symbols associated with the residue symbols are supplied to the Galois Field multipliers.

10. The combination encoder and decoder of claim 5 wherein the register, which is associated with the Galois Field multiplier that multiplies by the constant term of the generator polynomial, updates by feeding back the contents of the register when the residue symbols or symbols associated with the residue symbols are supplied to the Galois Field multiplier.

11. The combination encoder and decoder of claim 10 wherein the plurality of switches prevents the products produced by the Galois Field multipliers that multiply symbols by the remaining coefficients of the generator polynomial from reaching the adders when the residue symbols or symbols associated with the residue symbols are supplied to the Galois Field multipliers.

* * * * *